(12) United States Patent
Takei et al.

(10) Patent No.: US 6,384,680 B1
(45) Date of Patent: May 7, 2002

(54) RF AMPLIFIER WITH PLURAL COMBINERS

(75) Inventors: Ken Takei, Kawasaki; Kenji Sekine, Hinode, both of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/639,069

(22) Filed: Aug. 16, 2000

(30) Foreign Application Priority Data

Jan. 19, 2000 (JP) ........................................ 2000-014042

(51) Int. Cl.[7] ................................................ H03F 3/68
(52) U.S. Cl. ..................... 330/124 R; 330/295; 330/126
(58) Field of Search ............................. 330/53, 124 R, 330/126, 295

(56) References Cited

U.S. PATENT DOCUMENTS

| | | | | |
|---|---|---|---|---|
| 5,017,886 A | * | 5/1991 | Geller | 330/295 |
| 5,363,056 A | * | 11/1994 | Blauvelt | 330/149 |
| 5,694,433 A | * | 12/1997 | Dent | 330/124 R |
| 5,786,727 A | * | 7/1998 | Sigmon | 330/124 R |
| 5,872,481 A | * | 2/1999 | Sevic et al. | 330/124 R |
| 5,901,346 A | * | 5/1999 | Stengel et al. | 330/129 |
| 6,160,447 A | * | 12/2000 | Huang | 330/295 |

* cited by examiner

Primary Examiner—Robert Pascal
Assistant Examiner—Khanh Van Nguyen
(74) Attorney, Agent, or Firm—Antonelli, Terry, Stout & Kraus, LLP

(57) ABSTRACT

The present invention aims to provide a RF amplifier capable of controlling the generation of spurious signals when plural carriers are simultaneously amplified. The RF amplifier includes dividers for respectively dividing each of a plurality of input signals different in frequency of carrier from one another into plural form, phase shifters for respectively assigning weights to phases every divided signals corresponding to a number obtained by subtracting 1 from the divided plural numbers, first combiners for adding up the signals different in the frequency of carrier, of the divided signals and the signals subjected to the phase weighting, amplifiers for respectively amplifying signals outputted from the first combiners, and a second combiner for adding the signals outputted from the amplifiers together to thereby output one signal from the second combiner. Spurious signal components are canceled out by addition of the output signals of the amplifiers.

20 Claims, 14 Drawing Sheets

RF AMPLIFIER WITH PLURAL COMBINERS

BACKGROUND OF THE INVENTION

The present invention relates to a RF amplifier used in a mobile communication system wherein a plurality of terminals are connected to each of base stations, and particularly to a RF amplifier suitable for use in a mobile communication system which simultaneously uses a plurality of carriers different in frequency between each base station and one terminal.

A current mobile communication system, which performs communications through the use of radio waves, adopts a cellular system capable of using limited frequencies with satisfactory efficiency with a view toward increasing subscriber capacity to be held therein. As shown in FIG. 14, the cellular system is one wherein a range of a radio wave (frequency f1) emitted from one base station 60a is localized by sharpening the directivity of an antenna 61a to thereby narrow a service area like 62a, whereby a plurality of base stations (corresponding to a base station 60b in FIG. 14, whose antenna and service area are designated at 61b and 62b respectively) spaced one base station or more away from the base station 60a can utilize the same frequency f1.

In the current cellular mobile communication system from the viewpoint of a demand for downsizing of a terminal, the amount of information transfer required by a system, and attenuation characteristics of an electro-magnetic wave in free space, the range of the radio wave emitted from the base station is set from a few km to about 20 km, the frequency to be used ranges from several hundreds of MHz to a few GHz, and radiation power of one terminal ranges from a few hundreds of mW to about 2W.

The number of subscribers to be accommodated, which is required for one base station, reaches from several tens to several hundreds of subscribers under such conditions. To this end, average transmitting power of from several tens of W to several hundreds of W is required as the output of a transmitting power amplifier of the base station.

Digital mobile communications are mainstream at present to realize a variety of communication services. Since a modulation system takes phase/amplitude modulation in this case, a transmitting power amplifier needs to have high linearity. While a high-power RF semiconductor is used in the transmitting power amplifier, the efficiency of the same power amplifier is inevitably reduced in the existing circumstances to compensate for its non-linearity. Incidentally, the required transmitting power ranges from several hundreds of W to a few KW as a saturated output.

Assuming now that RF power is transmitted from a transmitting power amplifier placed adjacent to a base station for indoor use, having a ground height of several tens of m to an antenna installed at a height of 100 m, for example, the loss of a RF cable for connection cannot be neglected. Namely, since a loss of about 5 dB to 6 dB is normally generated when the length of the cable is about 100 m, it is necessary to increase the output of the transmitting power amplifier to about five times as the loss-free case. Accordingly, the transmitting power amplifier of the base station is installed as close to the antenna as possible.

Various services for providing more amounts of information have been proposed to obtain many subscribers and improve the utility of the system. With a view toward implementing such services, a method has been discussed which simultaneously uses a plurality of carriers (multi-carrier) different in frequency between a base station and one terminal, thereby increases the capacity of a radio communication network equivalently, and performing the transfer of larger amounts of data. A configuration of the base station used in the current multi-carrier mobile communication system for providing such services is shown in FIG. 15.

A modem 63 for modulating and demodulating plural carriers is placed inside an office or building for a base station 60. A plurality of output lines of the modem 63 are connected to an amplifier of a transmitting signal and amplifier of a receiving signal 64 installed near an array antenna 61 placed in the rooftop of the building. The amplifier of transmitting signal and amplifier of receiving signal 64 is connected to the array antenna 61 through a RF cable 65.

Upon use of the plural carriers, an increase in the number of antennas for the base station with an increase in frequency and the placement of a RF (Radio Frequency) unit comprising the modem 63 in the base station 60 and the amplifier of transmitting signal and amplifier of receiving signal 64, etc. in plural form will cause problems such as ensuring of a construction place, an increase in the number of in-office devices, etc. Even in the case of a terminal for receiving signals sent from the base station 60, the provision of a transmitting circuit and a high-output power amplifier every different frequencies to transmit the plural carriers will lead to an increase in circuit scale, an increase in the volume of the terminal and a rise in the cost of each part, thus causing a problem.

Therefore, a system for amplifying a plurality of frequencies of carriers by the same RF unit has been discussed. Circuit configurations of a general base station and a terminal having adopted such a system are respectively shown in FIGS. 16 and 17. An amplifier of transmitting signal and amplifier of receiving signal 64 of the base station has a multi-carrier power amplifier (RF amplifier) 66 for simultaneously amplifying plural carriers and a low noise amplifier 67 for amplifying the received plural carriers.

A circuitry of terminal 68 included in the terminal has a baseband LSI (BB LSI) 69 for processing data to be transmitted and received, an analog front end 70 for modulating and demodulating the data to thereby generate a plurality of carriers, a RF/IF transmitting circuit 71 for amplifying the plural carriers outputted from the analog front end 70 and effecting frequency conversion thereon, a multi-carrier power amplifier (RF amplifier) 72 for amplifying a plurality of radio frequency carriers, and a duplexer 74 for sending a transmitting signal outputted from the RF amplifier 72 to an antenna 73 and simultaneously sending a receiving signal inputted from the antenna 73 to a RF/IF receiving circuit 75. The receiving signal outputted from the RF/IF receiving circuit 75 is brought to receive data by the analog front end 70, followed by supply to the baseband LSI 69.

A circuit configuration for reducing distortion by feed-forward type feedback, which has been described in the specification of U.S. Pat. No. 4,580,105, for example, has been adopted for the multi-carrier power amplifiers 66 and 72 to amplify a plurality of carrier signals.

SUMMARY OF THE INVENTION

When signals having a plurality of frequencies are simultaneously inputted, RF amplifiers, i.e., multi-carrier power amplifiers for the current base station and terminal will produce unnecessary spurious signals called inter modulation spurious in the vicinity of the plural frequencies within a frequency band of a wireless system due to non-linearity of an amplification characteristic of a semiconductor. It is difficult to eliminate the spurious signals by an external filter because they appear within the frequency band of the system. Further, since the spurious correspond to spurious emissions, the spurious must be reduced to an allowable value or less by any means according to strict law's control.

A limitation is imposed on the method of reducing distortion by the single amplifier like the above-described conventional circuit. It is thus difficult to sufficiently suppress the generation of the spurious signals. In order to realize services by the multi-carrier mobile communication system using the plural carriers, the development of a method for reducing spurious signals caused by a multi-carrier becomes an important problem in terms of the development of a cellular base station and terminal.

An object of the present invention is to provide a RF amplifier having a novel configuration, which is capable of suppressing the generation of spurious signals when a plurality of carriers are simultaneously amplified.

According to one aspect of the invention, for achieving the above object, there is provided a RF amplifier comprising dividers for respectively dividing each of a plurality of input signals different in frequency of carrier from one another into plural form, phase shifters for respectively assigning a weight of phase to each of divided signals corresponding to a number obtained by subtracting 1 from the number of divisions, a plurality of first combiners for respectively adding up the signals different in the frequency of carrier, out of the divided signals and signals each assigned the weight of phase, a plurality of amplifiers for respectively amplifying signals outputted from the plurality of first combiners, and a second combiner for adding the signals outputted from the plurality of amplifiers to output one signal.

Owing to the above configuration wherein the divided signals and the signals each assigned the weight of phase are amplified and added up, the spurious components are canceled out each other by the addition made by the second combiner to thereby suppress the generation of the spurious signals.

The principle of the suppression of the spurious signals will be explained below with reference to FIGS. 10 through 13. FIG. 10 shows the case where the number of carriers is two. Two signals having different frequencies of carriers, which have $\omega 1$ and $\omega 2$ respectively, are defined as input signals. First of all, the signal of $\omega 2$ is shifted by a phase $\phi$ with the signal of $\omega 1$ as the reference and inputted to its corresponding amplifier. Next, the signal of $\omega 1$ is shifted by the phase $\phi$ with the signal of $\omega 2$ as the reference and inputted to its corresponding amplifier. Since the amplifier comprises a semiconductor, the lowest degree of inter modulation spurious in inter modulation spurious produced in a system frequency, i.e., frequency components of the same spurious closest to the carrier frequencies as viewed from a frequency axis are given as $2\times\omega 1-\omega 2$ and $2\times\omega 2-\omega 1$. The difference in phase between these spurious signals becomes $3\phi$. Therefore, if $\phi$ is set as $\phi=60°$ in advance, then third spurious will become zero in principle because of a phase difference of 180° with respect to each other as shown in FIG. 11. On the other hand, the attenuation of a main wave reaches 0.38 dB.

FIG. 12 shows an example in which a carrier signal is divided into four. If $\phi$ is set as $\phi=30°$ according to calculations similar to the above, then third spurious will become zero and the attenuation of a main wave reaches 0.22 dB, as shown in FIG. 13. At this time, 3i (where i=1, 2, 3, . . . )th spurious become all zero in principle, and other degrees of spurious are given an attenuation of 6.5 dB. Inter modulation spurious components corresponding to an arbitrary degree to be noted can be cancelled out by increasing the number of divisions of an input signal, adding up signals each assigned the weight of phase after their division, and selecting a suitable phase difference $\phi$.

According to another aspect of the invention, for achieving the above object, there is provided a RF amplifier comprising s outer input ports for inputting s (where s: integer greater than or equal to 2) signals different in frequency of carrier from one another, s 1:m dividers respectively connected to the s outer input ports and for dividing the input signals into m (where m: integer greater than or equal to 2), s×(m−1) phase shifters connected from second output ports of the s dividers to mth output ports thereof, s m:1 first combiners for inputting m output signals selected from s output signals sent from first output ports of the s dividers and s×(m−1) output signals of the s dividers sent via the phase shifters and combining the output signals into one, s power amplifiers substantially identical in characteristic, for respectively amplifying the output signals of the s first combiners, and an s:1 second combiner for inputting the output signals of the s power amplifiers and combining the output signals into one, and outputting the combined signal to an outer output port, and wherein the m output signals inputted to the first combiners are different in frequency of carrier from one another, and the s×m output signals inputted to the s first combiners are different from one another.

According to a further aspect of the invention, for achieving the above object, there is provided a RF amplifier comprising s outer input ports for inputting s signals different in frequency of carrier from one another, s 1:2n dividers respectively connected to the s outer input ports and for dividing the input signals into 2n (where n: positive integer) s×(2n−1) phase shifters connected from second output ports of the s dividers to 2 nth output ports thereof, sn 2:1 first combiners for inputting two output signals selected from s output signals sent from first output ports of the s dividers and s×(2n−1) output signals of the s dividers sent via the phase shifters and combining the output signals into one, sn power amplifiers substantially identical in characteristic, for respectively amplifying the output signals of the sn first combiners, and an sn:1 second combiner for inputting the output signals of the sn power amplifiers and combining the output signals into one, and outputting the combined signal to an outer output port, and wherein the two output signals inputted to each of the first combiners are different in frequency of carrier from each other, and the sn×2 output signals inputted to the sn first combiners are different from one another.

Incidentally, the characteristics of the power amplifier using the semiconductor are brought to the following manner because the performance thereof might vary due to the temperature, a change in source voltage, etc. It is desirable in the latter two configurations that the phase shifters connected to the output ports of the dividers are defined as first variable phase shifters, and first variable attenuators are respectively connected to the output ports of the dividers, whereby the first variable attenuators are inserted between the output ports of the dividers and the first variable phase shifters, a second variable attenuator is inserted between one predetermined first combiner and the power amplifier and a second variable attenuator and a second variable phase shifter are inserted in series between the other first combiner and the power amplifier, a directional coupler is inserted between the second combiner and the outer output port, and a control circuit for adjusting the first and second variable attenuators and the first and second variable phase shifters through the use of a signal outputted from the directional coupler is placed. Control on the adjustment by the specific control circuit in this case is carried out to adjust the first variable attenuators and the first variable phase shifters, thereby minimizing spurious components existing in the final output of the power amplifier and to control the second variable attenuator and the second variable phase shifter, thereby maximizing carrier components in the output of the power amplifier.

These and other objects and many of the attendant advantages of the invention will be readily appreciated as the same becomes better understood by reference to the following detailed description when considered in connection with the accompanying drawings.

DETAILED DESCRIPTION OF THE PREFERRED EMBODIMENTS

Figure 1:
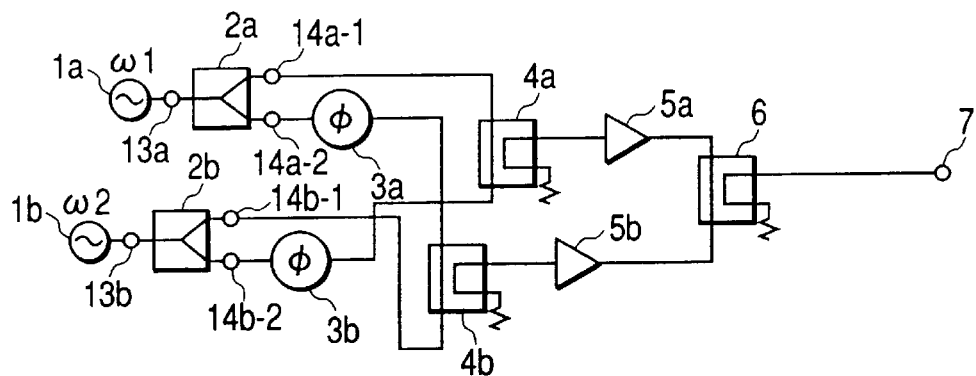
FIG. 1 is a block diagram for describing a first embodiment of a RF amplifier according to the present invention.

A RF amplifier according to the present invention will hereinafter be described in further detail with reference to preferred embodiments of the invention, based on several examples illustrated in the accompanying drawings. Incidentally, the same reference numerals shown in FIGS. 1 through 9 indicate the same ones or similar ones respectively.

<First Embodiment>

In FIG. 1, reference numeral 1*a* and 1*b* indicate external carrier signal generators for respectively generating signals whose frequencies of carriers are given as $\omega 1$ and $\omega 2$, reference numerals 13*a* and 13*b* indicate outer input ports for respectively inputting the signals sent from the carrier signal generators 1*a* and 1*b*, reference numerals 2*a* and 2*b* indicate 1:2 dividers for respectively dividing the signals inputted from the outer input ports 13*a* and 13*b* into two, reference numerals 14*a*-1 and 14*a*-2, and 14*b*-1 and 14*b*-2 respectively indicate first output ports and second output ports in order of the dividers 2*a* and 2*b*, reference numerals 3*a* and 3*b* respectively indicate phase shifters connected to the second output ports 14*a*-2 and 14*b*-2, reference numeral 4*a* indicates a 2:1 combiner for receiving the signal sent from the first output port 14*a*-1 of the divider 2*a* and the signal sent via the phase shifter 3*b* from the second output port 14*b*-2 of the divider 2*b* therein and combining the signals into one, reference numeral 4*b* indicates a 2:1 combiner for receiving the signal sent from the first output port 14*b*-1 of the divider 2*b* and the signal sent via the phase shifter 3*a* from the second output port 14*a*-2 of the divider 2*a* and combining the signals into one, reference numerals 5*a* and 5*b* respectively indicate power amplifiers for amplifying signals outputted from the combiners 4*a* and 4*b*, reference numeral 6 indicates a 2:1 combiner for receiving signals outputted from the power amplifiers 5*a* and 5*b* and combining the signals into one, and reference numeral 7 indicates an outer output port for outputting the output signal of the combiner 6 to the outside, respectively.

Figure 10:
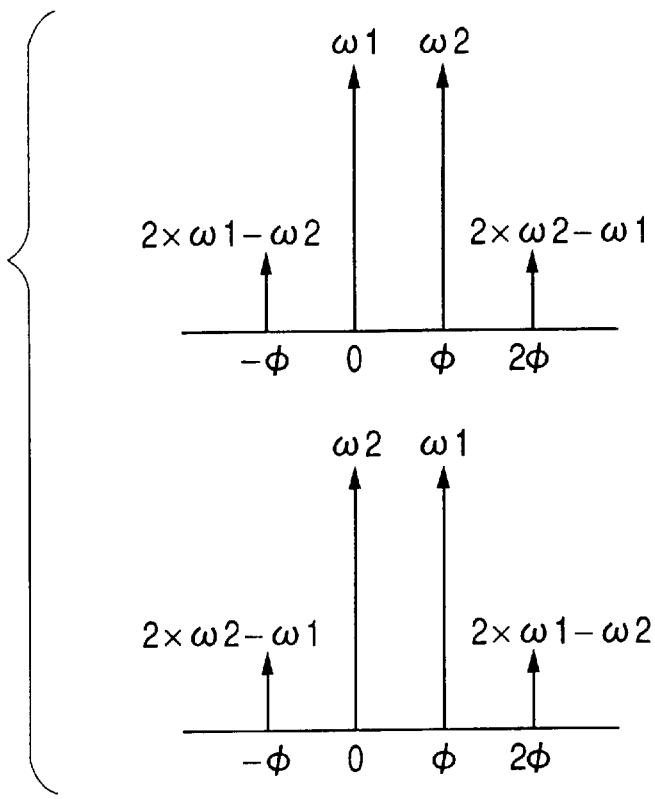
FIG. 10 is a diagram for describing the principle of operation of a RF amplifier according to the present invention.
Figure 11:
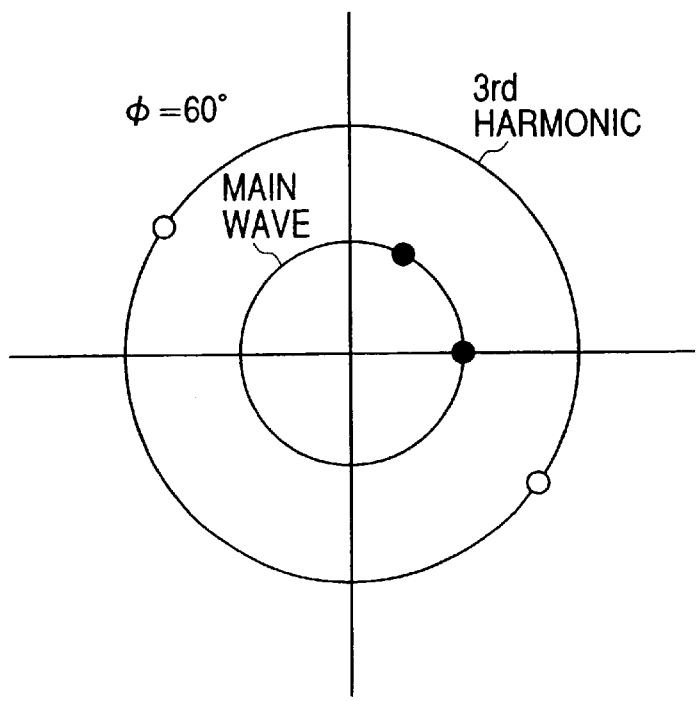
FIG. 11 is a diagram for describing the principle of spurious cancellation according to the present invention.
Figure 12:
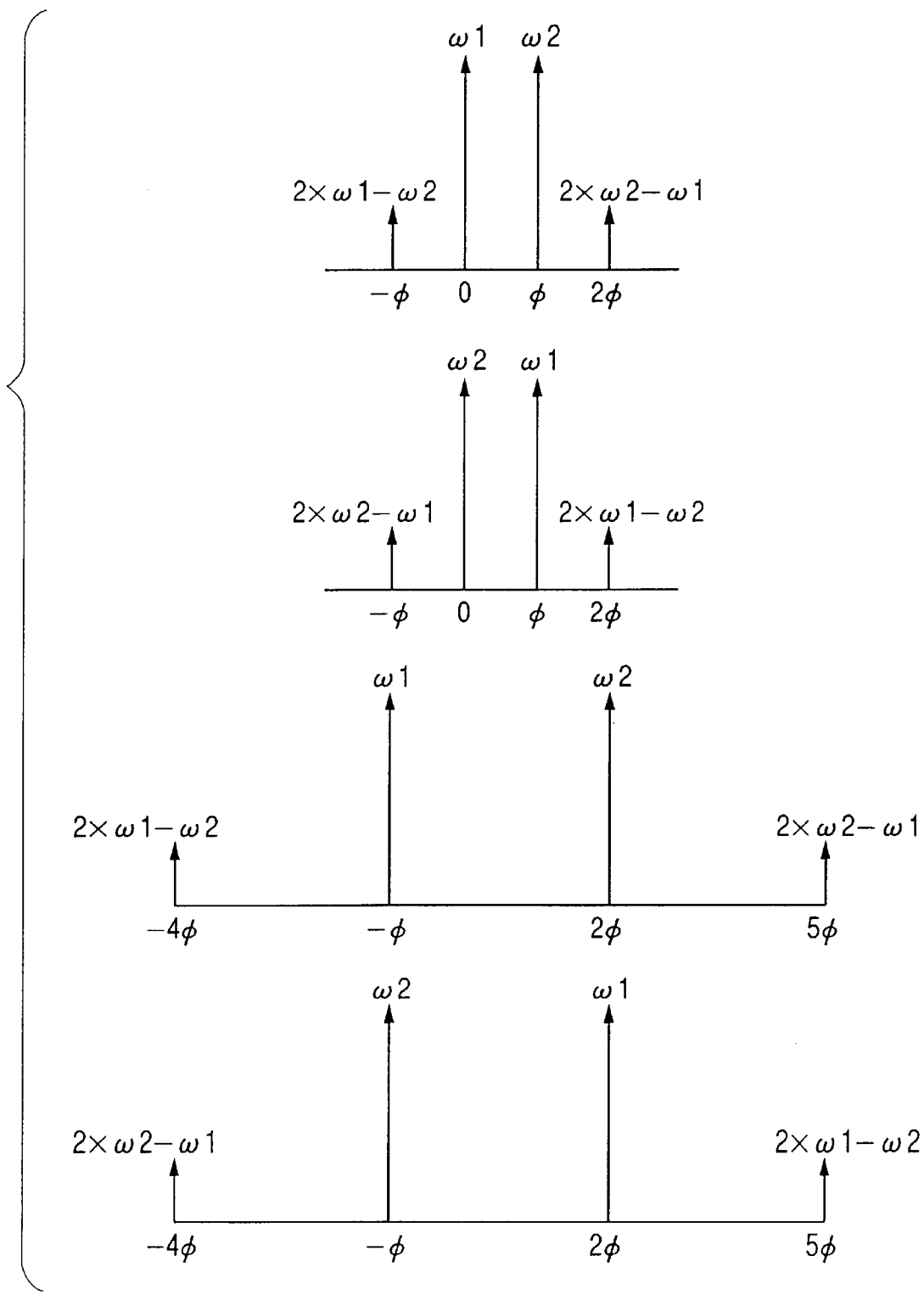
FIG. 12 is another diagram for describing the principle of operation of a RF amplifier according to the present invention.
Figure 13:
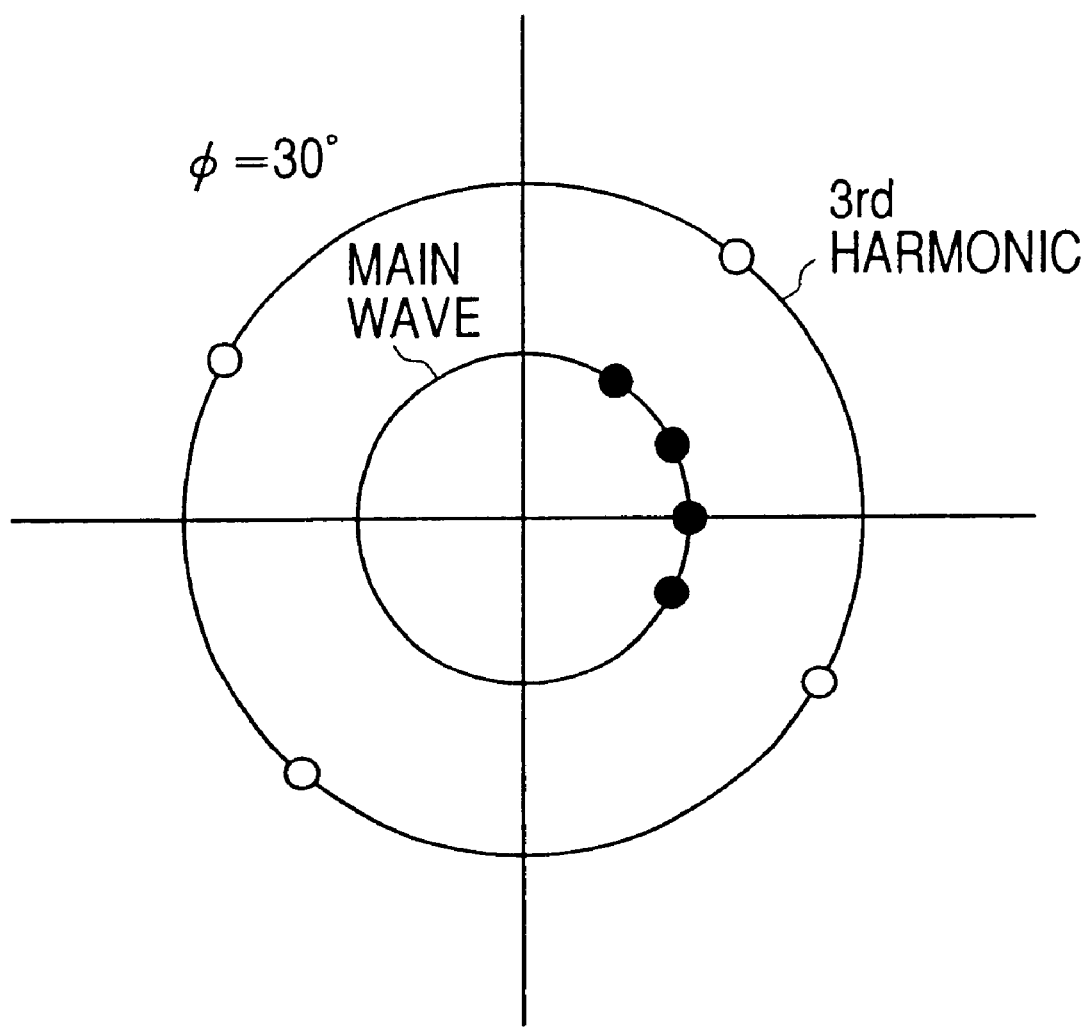
FIG. 13 is another diagram for describing the principle of spurious cancellation according to the present invention.
Figure 14:
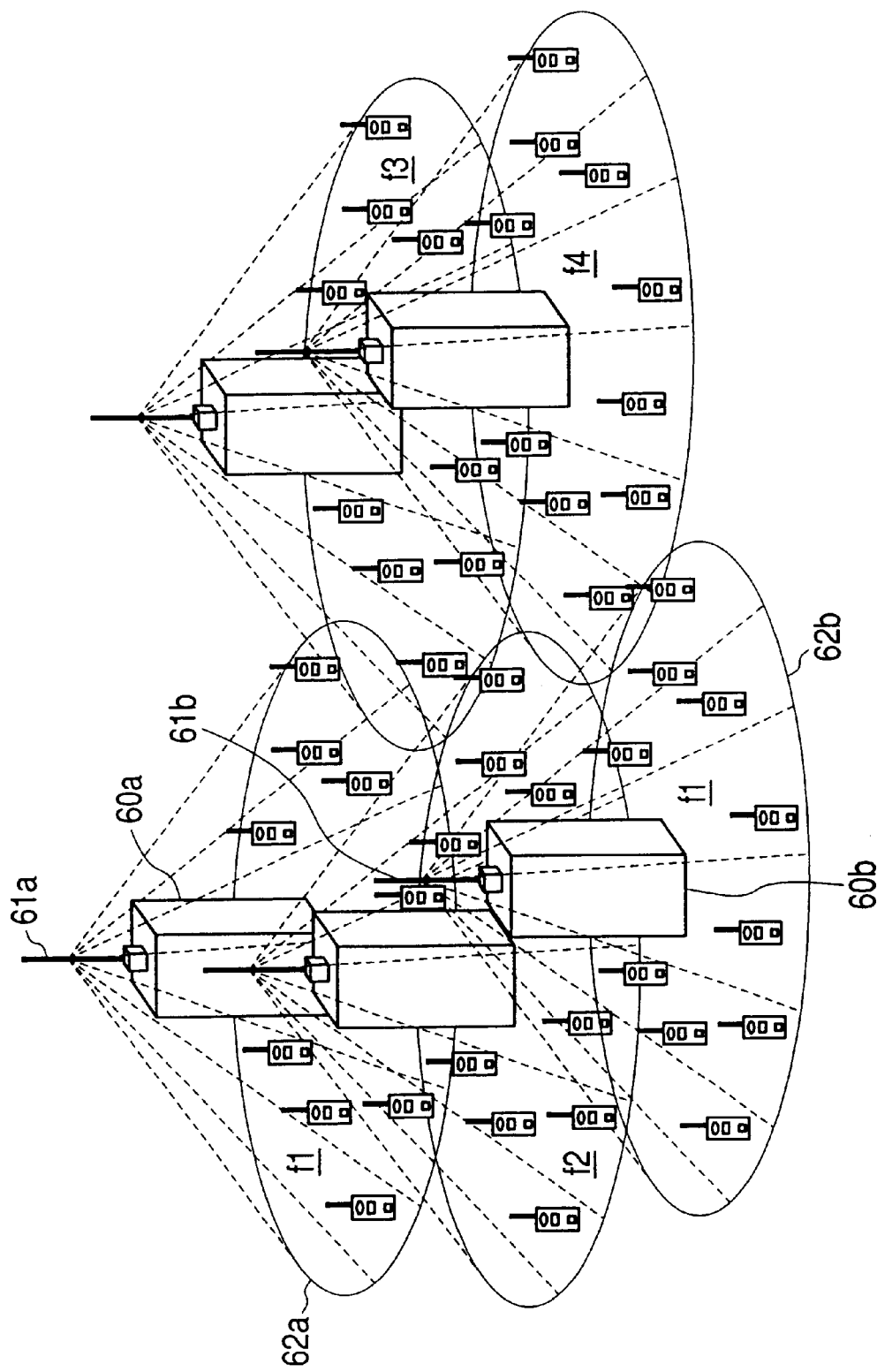
FIG. 14 is a configurational diagram for describing a summary of a cellular mobile communication system.

Owing to the above configuration, the signal outputted from the power amplifier 5*a* results in one shown on the upper side of FIG. 10, whereas the signal outputted from the power amplifier 5*b* results in one shown on the lower side of FIG. 10. Owing to the setting of phase amounts $\phi$ of the phase shifters 3*a* and 3*b* to 60°, third spurious of both output signals combined into one by the combiner 6 are canceled out.

Namely, according to the present embodiment, the two signals different in the frequency of carrier can be amplified without causing the third spurious. Incidentally, low attenuation corresponding to 0.6 dB and close to a theoretical value was obtained as the attenuation of a main wave as a result of measurements. The present embodiment corresponds to the case in which s=2, m=2 and s=2 and n=1.

Incidentally, the dividers are included in all the embodiments described below. Further, they can be configured as duplexers and are capable of obtaining effects similar to the above.

Figure 15:
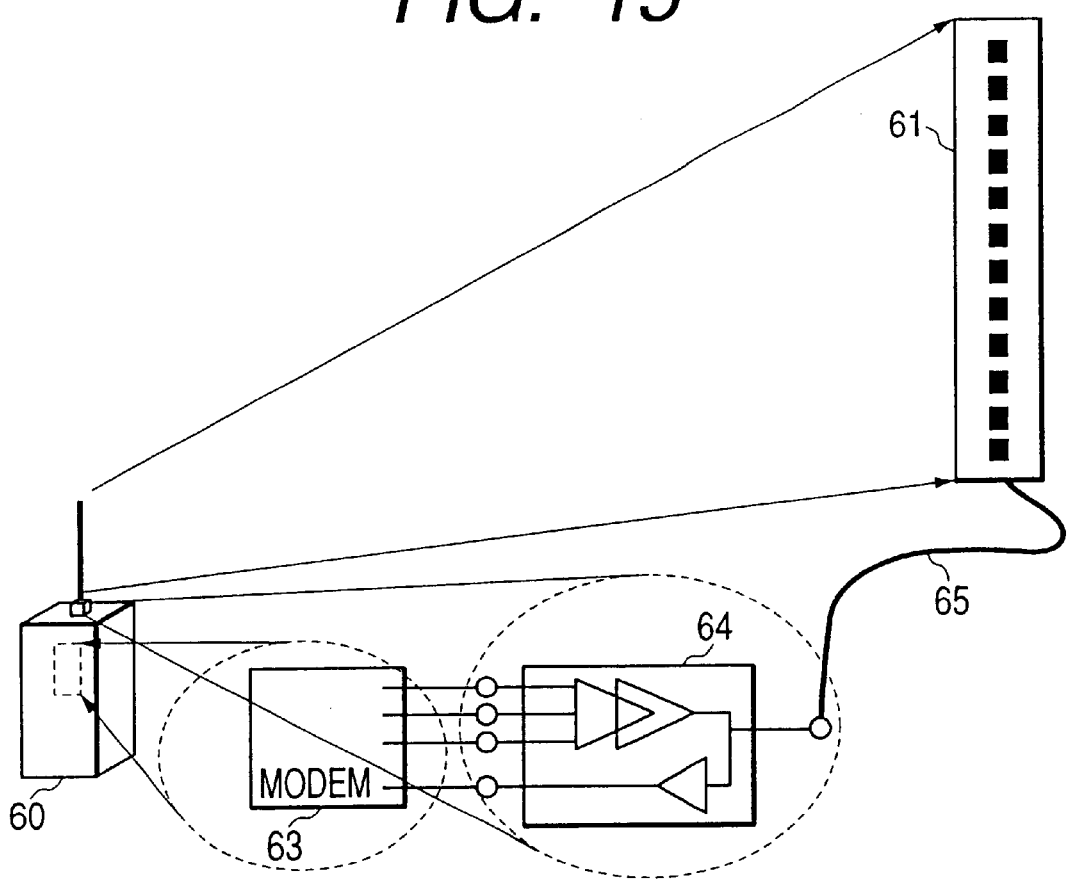
FIG. 15 is a configurational diagram for describing a summary of a base station of a cellular mobile communication system.
Figure 16:
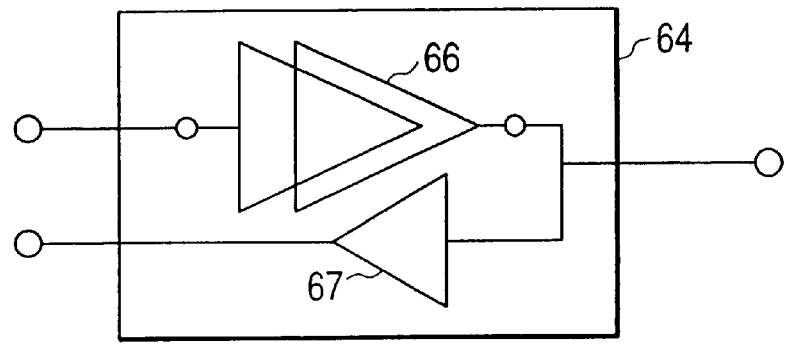
FIG. 16 is a block diagram for describing a circuit configuration of a conventional base station.

The base station of the multi-carrier mobile communication system to which the RF amplifier is applied, is shown in FIG. 15, and the configuration of the amplifier of transmitting signal and amplifier of receiving signal 64 is shown in FIG. 16. The RF amplifier is used as a multi-carrier power amplifier 66. The multi-carrier power amplifier 66 are supplied with plural carrier signals from the modem 63 and amplifies these signals while suppressing spurious signals thereof, after which it outputs the amplified output signal to the antenna 61. The base station is capable of offering much information to each terminal to more than ever by using the RF amplifier.

Figure 17:
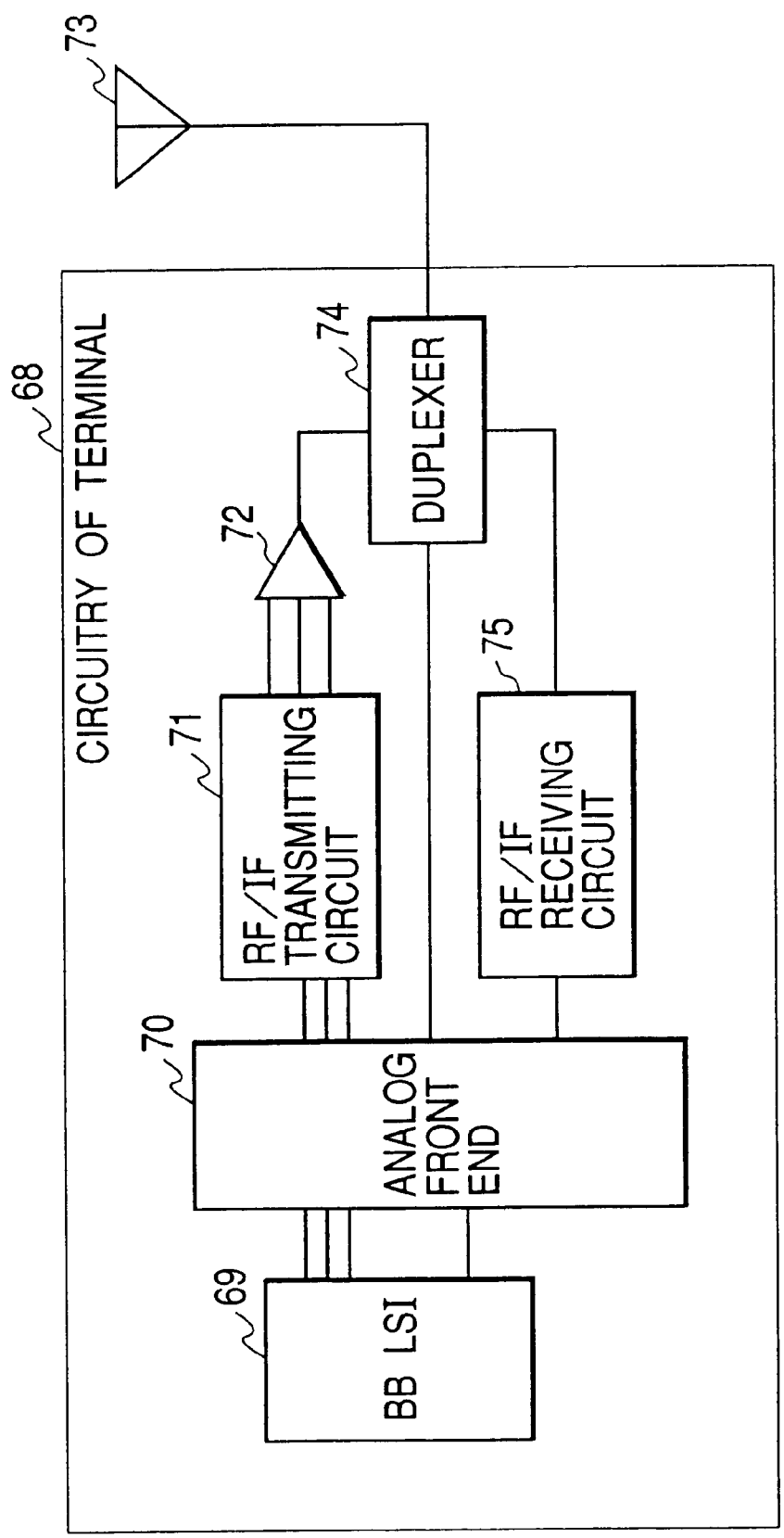
FIG. 17 is a block diagram for describing a circuit configuration of a conventional terminal.

The terminal of a multi-carrier mobile communication system to which the RF amplifier is applied, is shown in FIG. 17 aside from the above. The RF amplifier is used as the multi-carrier power amplifier 72 of the circuitry of terminal 68. A plurality of data generated by the baseband LSI (BB LSI) 69 are brought to a plurality of carrier signals via the analog front end 70 and the RF/IF transmitting circuit 71, followed by supply to the multi-carrier power amplifier 72. The multi-carrier power amplifier 72 amplifies these signals while suppressing spurious signals and outputs a signal to the antenna 73. The terminal is capable of transferring much information to more than ever by using the RF amplifier.

<Second Embodiment>

Figure 2:
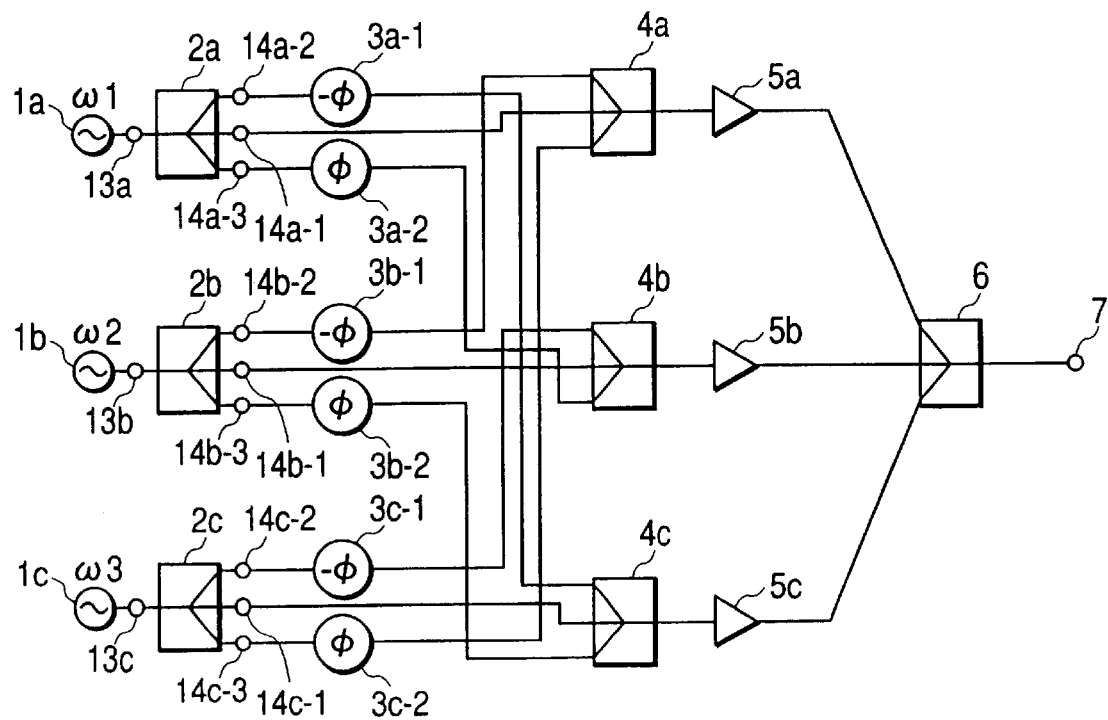
FIG. 2 is a block diagram for describing a second embodiment of the present invention.

An embodiment in which s=3 and m=3, is illustrated in FIG. 2. In FIG. 2, reference numeral 1a, 1b and 1c respectively indicate external carrier signal generators for generating signals whose frequencies of carriers are respectively ω1, ω2 and ω3, reference numerals 13a, 13b and 13c respectively indicate outer input ports for respectively inputting the signals outputted from the carrier signal generators 1a, 1b and 1c, reference numerals 2a, 2b and 2c respectively indicate 1:3 dividers for respectively dividing the signals inputted from the outer input ports 13a, 13b and 13c into three, reference numerals 14a-1, 14a-2 and 14a-3, and 14b-1, 14b-2 and 14b-3, and 14c-1, 14c-2 and 14c-3 respectively indicate first output ports, second output ports and third output ports in order of the dividers 2a, 2b and 2c, and reference numerals 3a-1, 3b-1, 3c-1 and 3a-2, 3b-2 and 3c-2 respectively indicate phase shifters connected to the second output ports 14a-2, 14b-2 and 14c-2 and the third output ports 14a-3, 14b-3 and 14c-3, respectively.

Further, reference numeral 4a indicates a 3:1 combiner for inputting the signal sent from the first output port 14a-1 of the divider 2a, the signal sent via the phase shifter 3b-1 from the second output port 14b-2 of the divider 2b, and the signal sent via the phase shifter 3c-2 from the third output port 14c-3 of the divider 2c and combining the signals into one, reference numeral 4b indicates a 3:1 combiner for inputting the signal sent from the first output port 14b-1 of the divider 2b, the signal sent via the phase shifter 3c-1 from the second output port 14c-2 of the divider 2c, and the signal sent via the phase shifter 3a-2 from the third output port 14a-3 of the divider 2a and combining the signals into one, and reference numeral 4c indicates a 3:1 combiner for inputting the signal sent from the first output port 14c-1 of the divider 2c, the signal sent via the phase shifter 3a-1 from the second output port 14a-2 of the divider 2a, and the signal sent via the phase shifter 3b-2 from the third output port 14b-3 of the divider 2b and combining the signals into one, respectively.

Furthermore, reference numerals 5a, 5b and 5c respectively indicate power amplifiers for respectively amplifying signals outputted from the combiners 4a, 4b and 4c, and reference numeral 6 indicates a 3:1 combiner for inputting the output signals of the power amplifiers 5a, 5b and 5c therein and combining them into one, and outputting the combined signal to an outer output port 7.

In the present embodiment, phase amounts −φ of the phase shifters 3a-1, 3b-1 and 3c-1 are set to −60°, and phase amounts of the phase shifters 3a-2, 3b-2 and 3c-2 are set to 60°, whereby third spurious of the three output signals from the amplifiers 5a, 5b and 5c, which are combined into one by the combiner 6, are canceled out.

Namely, the three signals different in the frequency of carrier from one another can be amplified without causing the third spurious owing to the present embodiment. Incidentally, low attenuation corresponding to 0.6 dB and close to a theoretical value was obtained as the attenuation of a main wave as a result of measurements.

<Third Embodiment>

Figure 3:
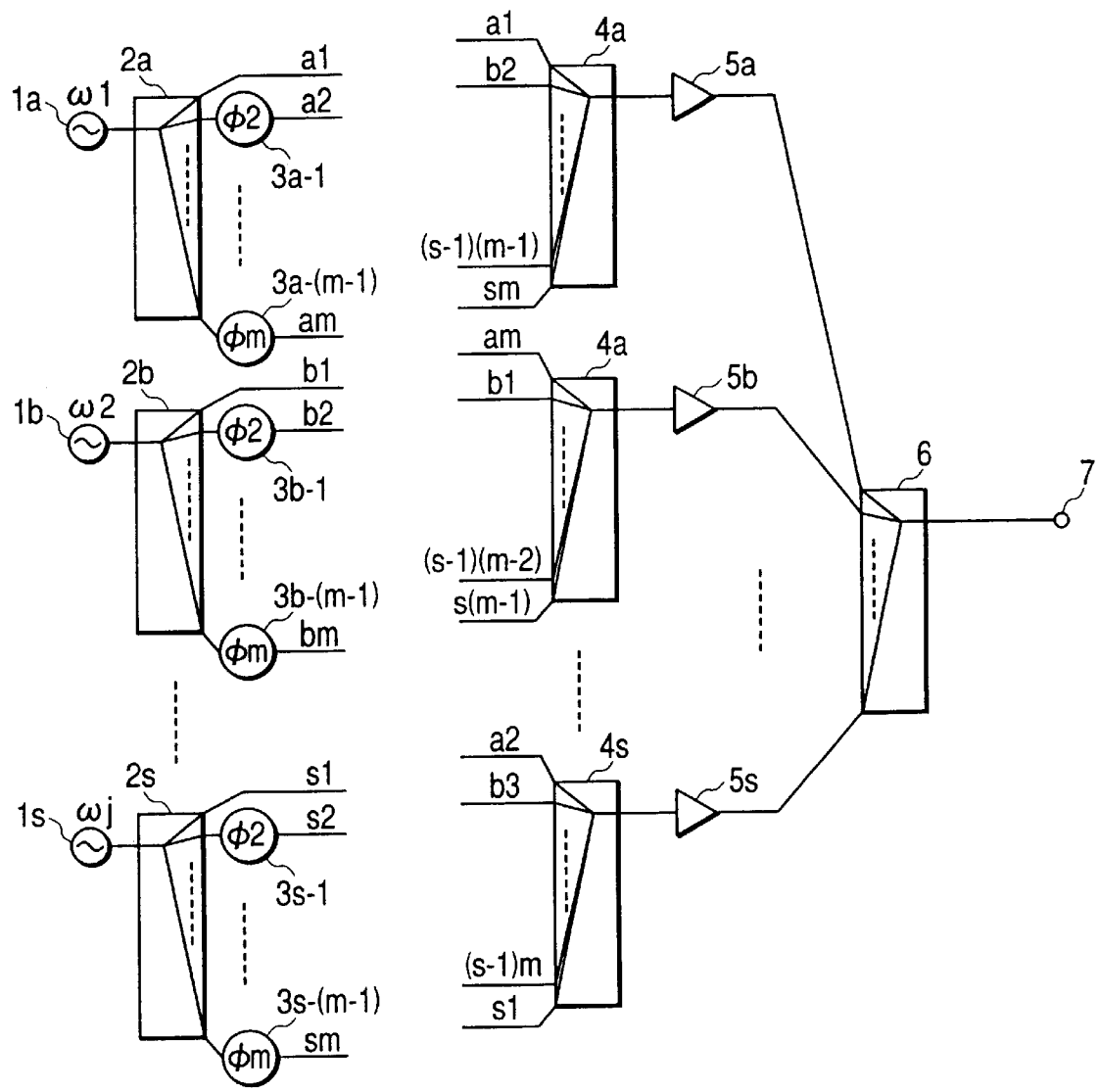
FIG. 3 is a block diagram for describing a third embodiment of the present invention.

An embodiment wherein s signals different in the frequency of carrier from one another are inputted and the number of divisions of each divider 2 is defined as m, is illustrated in FIG. 3. Namely, the number of carrier signal generators 1a, 1b, . . . 1s is s, the numbers of divisions of the s dividers 2a, 2b, . . . 2s are m respectively. With their numbers, the number of phase shifters respectively connected to the dividers 2a, 2b, . . . 2s is s×(m−1) in total, corresponding to the number of their corresponding phase shifters {3a-1, 3a-2, . . . 3a-(m−1)}, {3b-1, 3b-2, . . . 3b-(m−1)}, . . . {3s-1, 3s-2, . . . 3s-(m−1)}. A combination ratio among s combiners 4a, 4b, . . . 4s is m:1. In a manner similar to the first and second embodiments, signals utilized in combinations (including a case in which the phase is 0,° i.e., no phase shifters are connected) with weights, which are different in the frequency of carrier and phase, are respectively inputted from the dividers 2a, 2b, 2s to the combiners 4a, 4b, . . . 4s without excess and deficiency.

This will be described in detail here. The signals sent directly from the respective dividers and the signals sent via the phase shifters 3a, 3b, . . . 3s, both of which are outputted from the dividers 2a, 2b, . . . 2s, respectively result in signals {a1, a2, . . . am}, {b1, b2, . . . bm}, . . . {s1, s2, . . . sm}. The signals inputted to the combiners 4a, 4b, . . . 4s respectively result in {a1, b2, . . . (s−1) (m−1) , sm}, {am,b1, . . . (s−1) (m−2), s(m−1}, . . . {a2, b3, . . . (s−1)m, s1}.

Consecutively, signals outputted from the combiners 4a, 4b, 4s are respectively amplified by power amplifiers 5a, 5b, 5s. Further, the output signals of the power amplifiers 5a, 5b, . . . 5s are combined into one by an s:1 combiner 6 from which the combined output signal is supplied to an outer output port 7.

Now, the phases of the signals sent directly from the dividers and the signals sent via the phase shifters 3a, 3b, . . . 3s, both of which are outputted from the dividers 2a, 2b, . . . 2s, are given by (120°/m)×k, k=−1, 0, 1, . . . (m−2).

The present embodiment brings about an effect in that the degree of freedom for suppressing arbitrary degrees of spurious signals increases as compared with the first and second embodiments.

<Fourth Embodiment>

Figure 4:
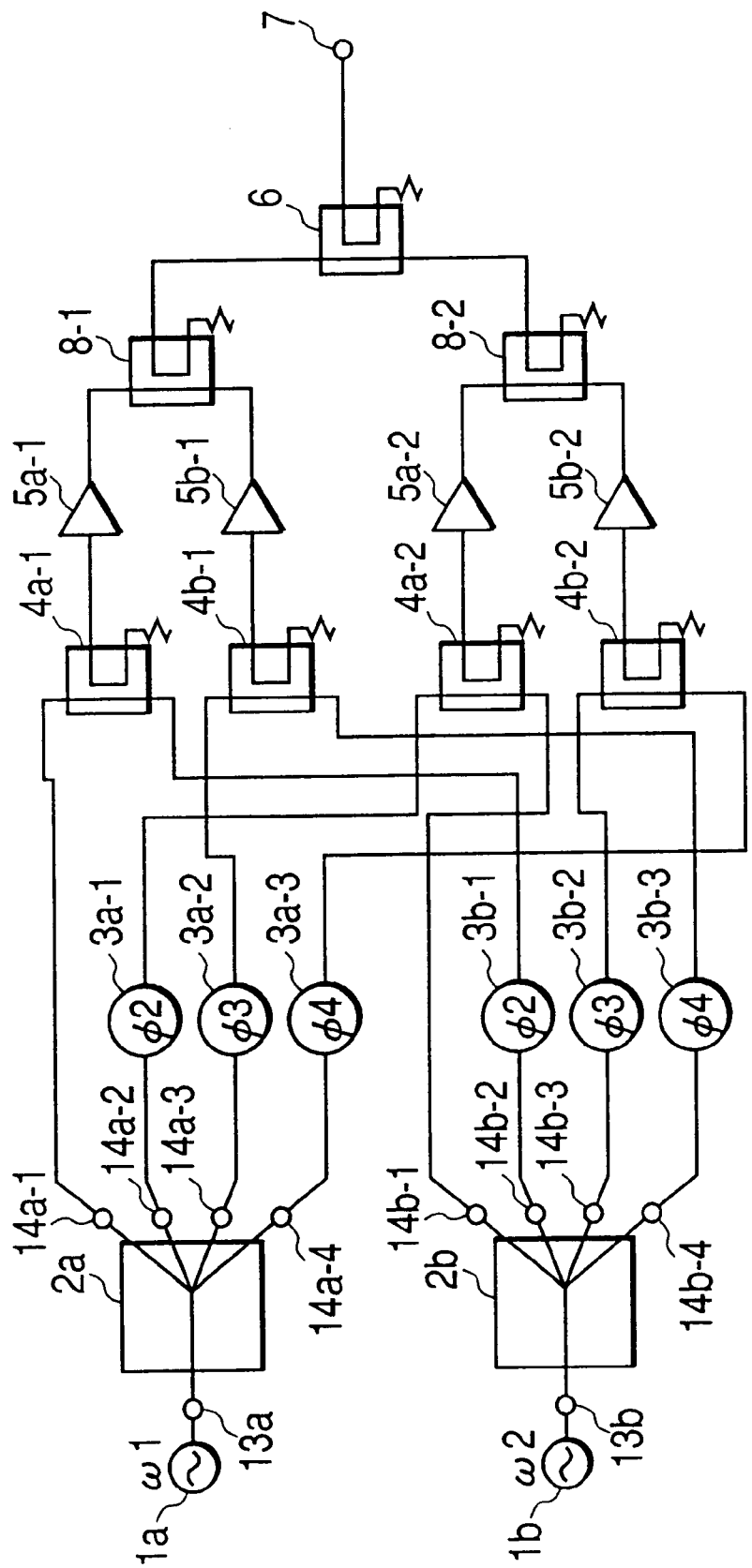
FIG. 4 is a block diagram for describing a fourth embodiment of the present invention.

An embodiment in which s=2 and n=2, is shown in FIG. 4. In FIG. 4, reference numerals 2a and 2b respectively indicate 1:4 dividers for dividing signals generated from carrier signal generators 1a and 1b into 2n, i.e., four, reference numerals 14a-1, 14a-2, 14a-3, 14a-4, and 14b-1, 14b-2, 14b-3 and 14b-4 respectively indicate first, second, third and fourth output ports in order of the dividers 2a and 2b, reference numerals 3a-1, 3a-2 and 3a-3 respectively indicate phase shifters connected to the second, third and fourth output ports 14a-2, 14a-3 and 14a-4 of the divider 2a, and reference numerals 3b-1, 3b-2 and 3b-3 respectively indicate phase shifters connected to the second, third and fourth output ports 14b-2, 14b-3 and 14b-4 of the divider 2b, respectively.

Reference numeral 4a-1 indicates a 2:1 combiner for inputting a signal sent from the first output port 14a-1 of the divider 2a and a signal sent via the phase shifter 3b-1 from the second output port 14b-2 of the divider 2b and combining the signals into one, reference numeral 4b-1 indicates a 2:1 combiner for inputting a signal sent via the phase shifter 3a-2 from the third output port 14a-3 of the divider 2a and a signal sent via the phase shifter 3b-3 from the fourth output port 14b-4 of the divider 2b and combining the signals into one, reference numeral 4a-2 indicates a 2:1 combiner for inputting a signal sent via the phase shifter 3a-1 from the second output port 14a-2 of the divider 2a and a signal sent from the first output port 14b-1 of the divider 2b and combining the signals into one, and reference numeral 4b-2 indicates a 2:1 combiner for inputting a signal sent via the phase shifter 3a-3 from the fourth output port 14a-4 of the divider 2a and a signal sent via the phase shifter 3b-2 from the third output port 14b-3 of the divider 2b, respectively.

Further, reference numerals 5a-1, 5b-1, 5a-2 and 5b-2 respectively indicate power amplifiers for respectively amplifying signals outputted from the combiners 4a-1, 4b-1, 4a-2 and 4b-2, reference numeral 8-1 indicates a 2:1 combiner for combining signals outputted from the power amplifiers 5a-1 and 5b-1 into one, reference numeral 8-2 indicates a 2:1 combiner for combining signals outputted from the power amplifiers 5a-2 and 5b-2 into one, and reference numeral 6 indicates a 2:1 combiner for combining signals outputted from the combiners 8-1 and 8-2 and outputting the combined signal to an outer output port 7.

Incidentally, the combiners 8-1 and 8-2 and the combiner 6 can be set as a single 4:1 combiner which receives all the output signals of the power amplifiers therein.

In the present configuration, a phase amount $\phi 2$ of the phase shifter 3a-1, a phase amount $\phi 3$ of the phase shifter 3a-2, and a phase amount $\phi 4$ of the phase shifter 3a-3 are respectively set to 30°, 60° and −30°, and a phase amount $\phi 2$ of the phase shifter 3b-1, a phase amount $\phi 3$ of the phase shifter 3b-2 and a phase amount $\phi 4$ of the phase shifter 3b-3 are respectively set to 30°, 60° and −30°. As a result, 3ith spurious in the output signal at the outer output port 7 is suppressed and other degrees of spurious are reduced by 6.5 dB. The 3rd spurious is normally large and high degrees of spurious such as 5th spurious, 7th spurious, etc. are reduced with an increase in the degree. Thus, according to the present embodiment, general degrees of spurious of amplifier's outputs can be reduced. Incidentally, low attenuation corresponding to 0.22 dB was obtained as the attenuation of a main wave as a result of measurements.

<Fifth Embodiment>

Figure 5:
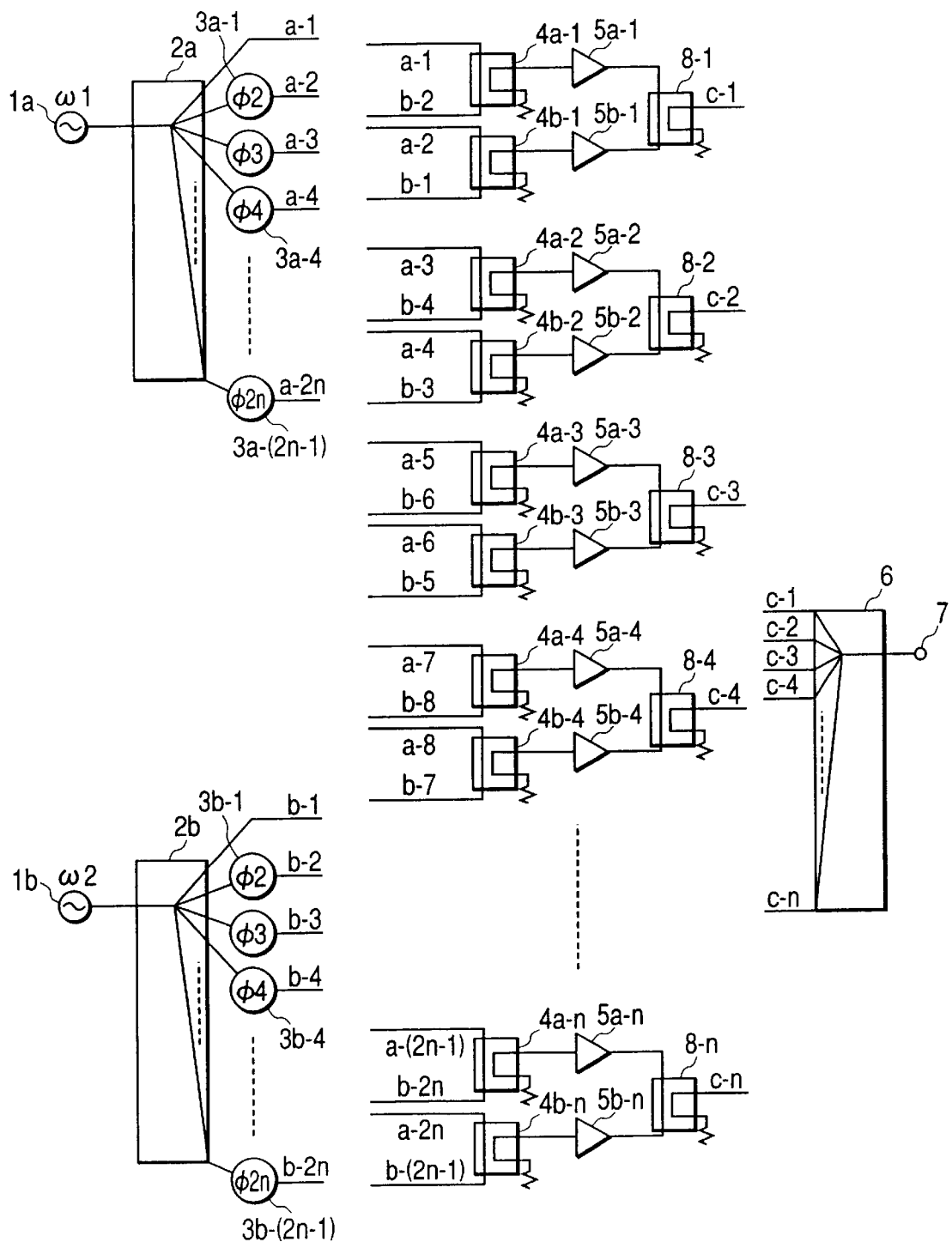
FIG. 5 is a block diagram for describing a fifth embodiment of the present invention.

An embodiment in which s=2 and the number of divisions of each divider 2 is 2n, is illustrated in FIG. 5. Namely, the numbers of divisions of dividers 2a and 2b are respectively 2n. With the number of divisions, the number of phase shifters connected to the dividers 2a and 2b is 2(2n−1) in total, corresponding to the number of their corresponding phase shifters 3a-1, 3a-2, . . . 3a-(2n−1) and phase shifters 3b-1, 3b-2, 3b-3, . . . 3b-(2n−1). Any of combination ratios among 2 n combiners 4a-1, 4b-1, 4a-2, 4b-2, 4a-3, 4b-3, 4a-4, 4b-4, 4a-n, 4b-n is 2:1. Signals utilized in combinations (including a case in which the phase is 0°, i.e., no phase shifters are connected) with weights, which are different in the frequency of carrier and phase, are respectively inputted from the dividers 2a and 2b to the combiners without excess and deficiency.

This will be described in detail here. The signals sent directly from the respective dividers and the signals sent via the phase shifters 3a and 3b, both of which are outputted from the dividers 2a and 2b, respectively result in signals {a-1, a-2, a-3, a-4, . . . a−2n}, {b-1, b-2, b-3, b-4, . . . b−2n}. The signals inputted to the combiners 4a-1, 4b-1, 4a-2, 4b-2, 4a-3, 4b-3, 4a-4, 4b-4, . . . 4a-n, 4b-n respectively result in {a-1, b-2}, {a-2, b-1}, {a-3, b-4}, {a-4, b-3}, {a-5, b-6}, {a-6, b-5}, {a-7, b-8}, {a-8, b-7}, . . . {a-(2n−1), b-2n}, {a-2n, b-(2n−1)} in that order.

Consecutively, signals outputted from the combiners 4a-1, 4b-1, 4a-2, 4b-2, 4a-3, 4b-3, 4a-4, 4b-4, . . . 4a-n, 4b-n are respectively amplified by 2 n power amplifiers 5a-1, 5b-1, 5a-2, 5b-2, 5a-3, 5b-3, 5a-4, 5b-4, . . . 5a-n, 5b-n in that order. Further, the output signals of the power amplifiers 5a-1 and 5b-1 are supplied to a 2:1 combiner 8-1, the output signals of the power amplifiers 5a-2 and 5b-2 are supplied to a 2:1 combiner 8-2, the output signals of the power amplifiers 5a-3 and 5b-3 are supplied to a 2:1 combiner 8-3, the output signals of the power amplifiers 5a-4 and 5b-4 are supplied to a 2:1 combiner 8-4, and the output signals of the power amplifiers 5a-n and 5b-n are supplied to a 2:1 combiner 8-n, respectively. Further, signals c-1, c-2, c-3, c-4, . . . c-n outputted from the combiners 8-1, 8-2, 8-3, 8-4, . . . 8-n are combined into one by an n:1 combiner 6, from which the combined output signal is supplied to an outer output port 7.

Incidentally, the combiners 8 and 6 can be configured as a single 2n:1 combiner to which all the output signals produced from the power amplifiers are inputted.

Now, the phases of the signals a-1 to a-2n and b-1 to b-2n are respectively given by $(120°/2n) \times k$, k=−1, 0, 1, . . . (2n−2).

The present embodiment brings about an effect in that the degree of freedom for suppressing arbitrary degrees of spurious signals increases as compared with the fourth embodiment.

<Sixth Embodiment>

Figure 6:
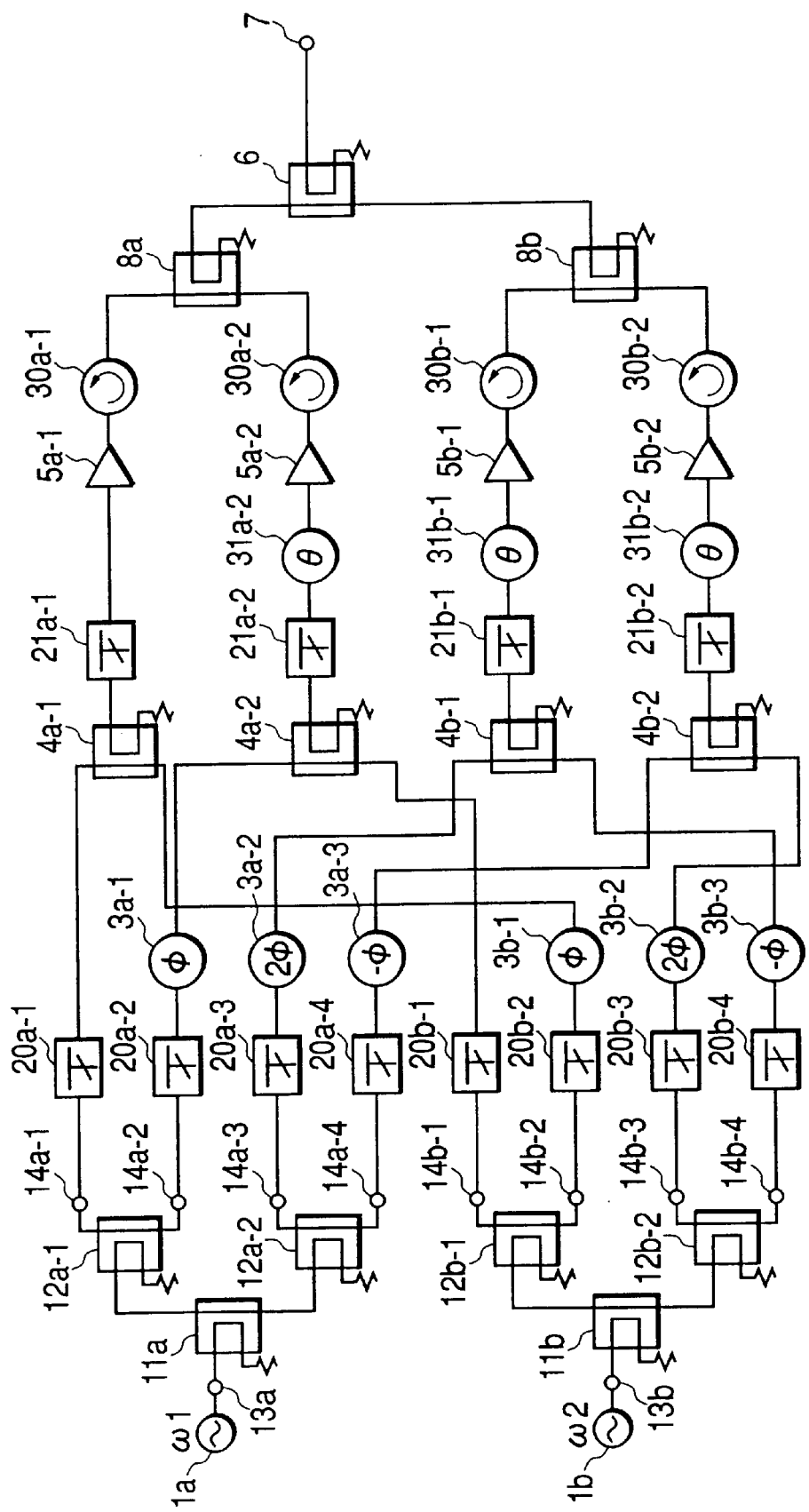
FIG. 6 is a block diagram for describing a sixth embodiment of the present invention.

FIG. 6 shows an embodiment capable of controlling the suppression of spurious signals by using variable phase shifters and variable attenuators. The present embodiment is based on the fourth embodiment. The dividers 2a and 2b employed in the fourth embodiment respectively comprise a tournament combination of directional couplers 11a, 12a-1 and 12a-2 and a tournament combination of directional couplers 11b, 12b-1 and 12b-2. Variable attenuators 20a-1 and 20a-2 are connected to their corresponding output ports 14a-1 and 14a-2 of the directional coupler 12a-1. Variable attenuators 20a-3 and 20a-4 are connected -to their corresponding output ports 14a-3 and 14a-4 of the directional coupler 12a-2. Variable attenuators 20b-1 and 20b-2 are connected to their corresponding output ports 14b-1 and 14b-2 of the directional coupler 12b-1. Variable attenuators 20b-3 and 20b-4 are connected to their corresponding output ports 14b-3 and 14b-4 of the directional coupler 12b-2.

Thus, connections of phase shifters 3a-1, 3a-2 and 3a-3 to the output ports 14a-2, 14a-3 and 14a-4 are established through the variable attenuators 20a-2, 20a-3 and 20a-4 respectively. Connections of phase shifters 3b-1, 3b-2 and 3b-3 to the output ports 14b-2, 14b-3 and 14b-4 are made through the variable attenuators 20b-2, 20b-3 and 20b-4. Incidentally, a phase amount of each phase shifter is expressed as $\phi=30°$ in FIG. 6.

A variable attenuator 21a-1 is connected between a combiner 4a-1 and a power amplifier 5a-1, a variable attenuator 21a-2 and a variable phase shifter 31a-2 are series-connected between a combiner 4a-2 and a power amplifier 5a-2, a variable attenuator 21b-1 and a variable phase shifter 31b-1 are series-connected between a combiner 4b-1 and a power amplifier 5b-1, and a variable attenuator 21b-2 and a variable phase shifter 31b-2 are series-connected between a combiner 4b-2 and a power amplifier 5b-2, respectively.

Further, isolators 30a-1 and 30a-2 are respectively connected between the power amplifiers 5a-1 and 5a-2 and a combiner 8a. Isolators 30b-1 and 30b-2 are respectively connected between the power amplifiers 5b-1 and 5b-2 and a combiner 8b.

Owing to the use of the respective variable phase shifters and variable attenuators referred to above, spurious signals included in a signal outputted to an outer output port 7, and a carrier signal can be controlled to the minimum and maximum respectively.

According to the present embodiment, circuit control becomes easy as compared with the second embodiment where the spurious signals increase with a variation in the characteristic of each power amplifier due to a secular change, a variation in temperature, a change in source voltage, etc. It is also possible to maintain a spurious signal suppressing effect stabler.

<Seventh Embodiment>

Figure 7:
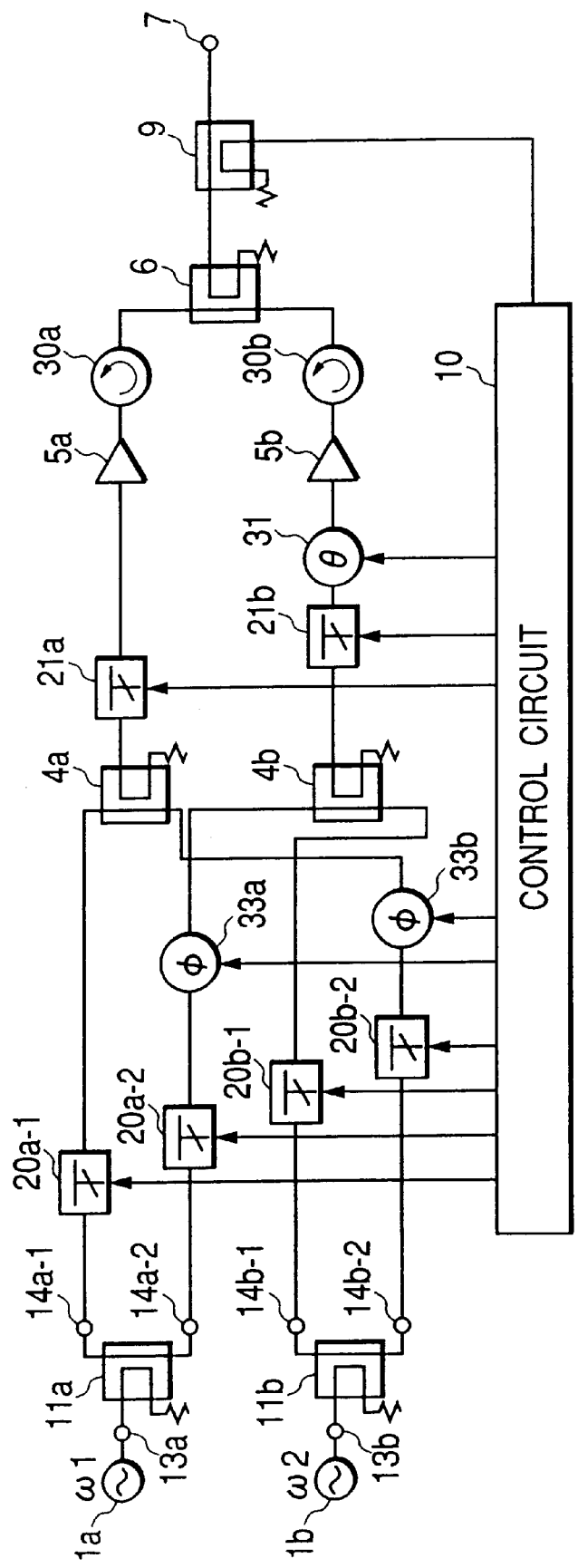
FIG. 7 is a block diagram for describing a seventh embodiment of the present invention.

An embodiment wherein control on the suppression of spurious signals, which is carried out through the use of variable phase shifters and variable attenuators, is always performed by a control circuit, is illustrated in FIG. 7. The present embodiment is based on the first embodiment. The dividers 2a and 2b employed in the first embodiment are respectively replaced by directional couplers 11a and 11b. Variable attenuators 20a-1 and 20a-2 are connected to their corresponding output ports 14a-1 and 14a-2 of the directional coupler 11a. Variable attenuators 20b-1 and 20b-2 are connected to their corresponding output ports 14b-1 and 14b-2 of the directional coupler 11b. Further, the phase shifters 3a and 3b are respectively replaced with variable phase shifters 33a and 33b. Thus, a connection of the variable phase shifter 33a to the output port 14a-2 is done via the variable attenuator 20a-2, and a connection of the variable phase shifter 33b to the output port 14b-2 is performed via the variable attenuator 20b-2.

Further, a variable attenuator 21a is connected between a combiner 4a and a power amplifier 5a, a variable attenuator 21b and a variable phase shifter 31 are connected in series between a combiner 4b and a power amplifier 5b, and isolators 30a and 30b are respectively connected between the power amplifiers 5a and 5b and a combiner 6.

The variable attenuators and variable phase shifters respectively adopt those in which attenuation and phase amounts respectively change according to control signals.

A directional coupler 9 is connected between the combiner 6 and an outer output port 7. A control circuit 10 is provided which receives a distribution output signal from the directional coupler 9 to thereby generate control signals to be supplied to the variable attenuators and variable phase shifters.

The control circuit 10 controls the variable attenuators 20a-1, 20a-2, 20b-1 and 20b-2, the variable phase shifters 33a and 33b, the variable attenuators 21a and 21b and the variable phase shifter 31, based on the control signals in response to an output signal obtained from the combiner 6 and performs control for minimizing spurious signals and maximizing a carrier signal at the outer output port 7.

According to the present embodiment, a spurious signal suppressing effect can automatically be maintained as compared with the first embodiment even when the characteristic of each power amplifier varies due to a secular change, a variation in temperature, a change in source voltage, etc.

<Eighth Embodiment>

Figure 8:
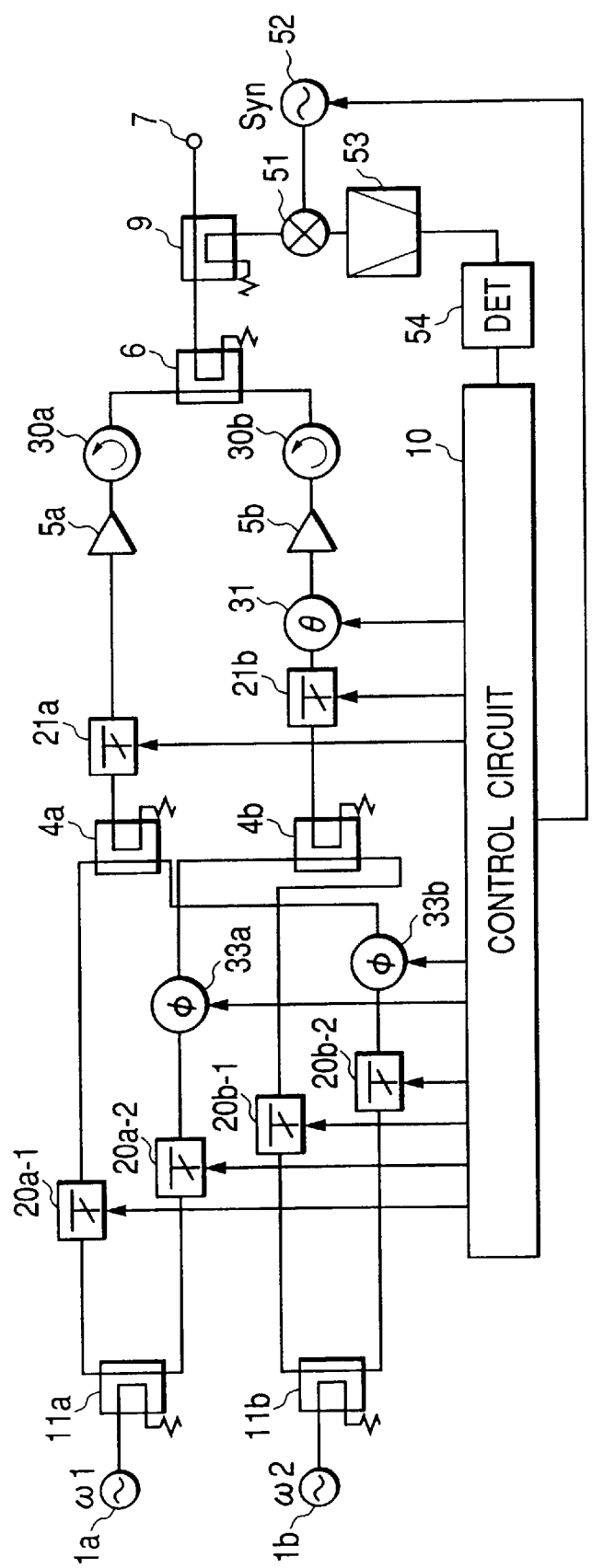
FIG. 8 is a-block diagram for describing an eighth embodiment of the present invention.

An embodiment wherein a frequency band to be controlled by the control circuit 10 employed in the seventh embodiment is changed through the use of frequency synthesizer, is shown in FIG. 8. In the present embodiment, a distribution output signal of a directional coupler 9 is mixed with a signal sent from a frequency synthesizer 52 by a mixer 51. A signal outputted from the mixer 51 is inputted to the control circuit 10 via a bandpass filter 53 and a detector 54. Oscillation frequency of the frequency synthesizer 52 is controlled by the control circuit 10. Incidentally, an illustration of an outer input port 13 and an output port 14 is omitted from FIG. 8.

Owing to the operations of the respective circuits added to the seventh embodiment, the control circuit 10 is capable of changing a frequency band for referable signals according to a change in oscillation frequency of the frequency synthesizer 52. Thus, for example, the oscillation frequency is changed to extract arbitrary degrees of spurious signals. Further, variable attenuators 20a-1, 20a-2, 20b-1 and 20b-2 and variable phase shifters 33a and 33b are controlled to minimize arbitrary degrees of spurious components which exist in an output obtained from a combiner 6. Next, the oscillation frequency is changed to take out a signal having a frequency of carrier this time. Then, variable attenuators 21a and 21b and a variable phase shifter 31 are controlled to maximize carrier components in an output obtained from each amplifier. Thus, the ratio of each spurious signal to the carrier frequency signal can be enlarged.

The present embodiment can be configured without including large part elements. Namely, the directional couplers can be implemented by patterns for a printed circuit board. When the required output is low, the isolators 30a and 30b become unnecessary. The variable phase shifter can be implemented by a PIN diode and a print pattern. Further, the variable attenuator can be implemented by a PIN diode. The present embodiment configured in this way is easily applicable to a terminal in particular.

<Ninth Embodiment>

Figure 9:
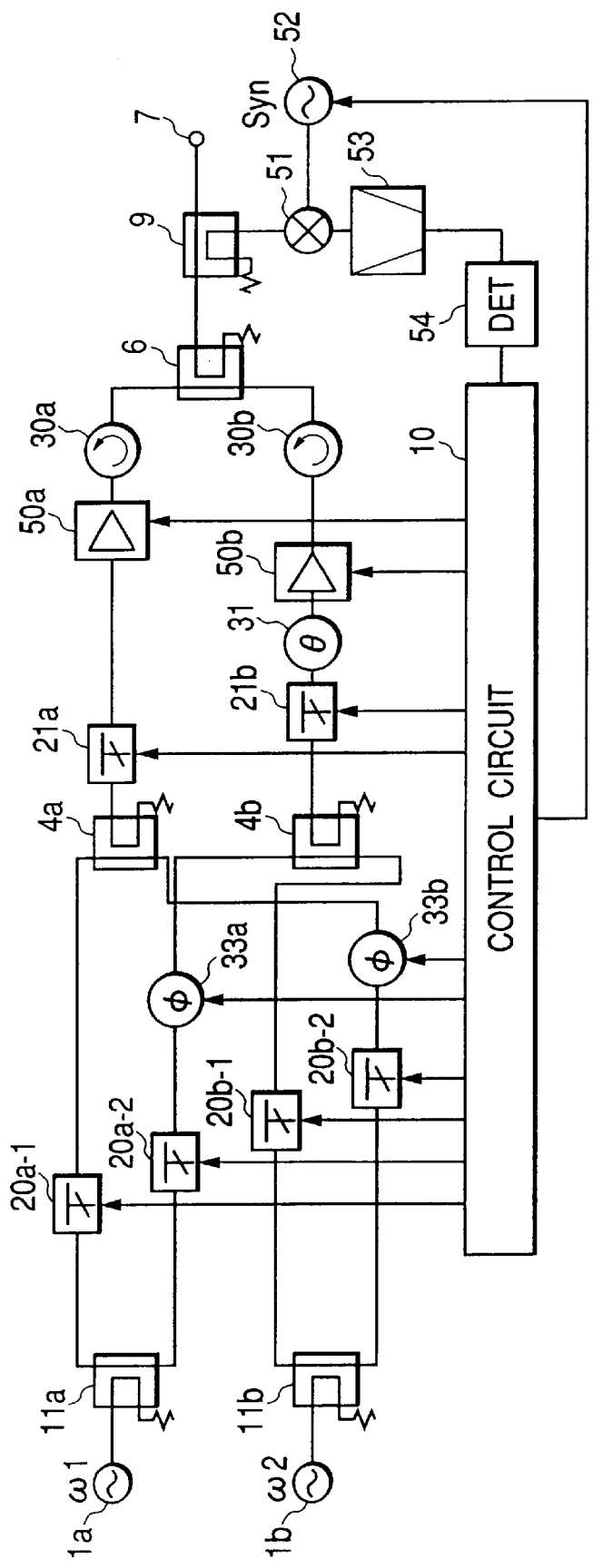
FIG. 9 is a block diagram for describing a ninth embodiment of the present invention.

An embodiment in which the power amplifiers 5a and 5b employed in the eighth embodiment are respectively replaced by feedforward amplifiers, is illustrated in FIG. 9. In FIG. 9, reference numerals 50a and 50b indicate the replaced feedforward amplifiers. Since the feedforward amplifiers 50a and 50b make it possible to always restrain distortion as low as possible based on control signals, a change in characteristic with respect to a change in ambient environment can be reduced. The control signals are supplied from a control circuit 10. An advantageous effect can be obtained in that the effect of suppressing spurious signals is stabilized by using the feedforward amplifiers 50a and 50b being originally stabilized in distortion suppression.

The feedforward amplifiers are used as distortion compensating power amplifiers in a cellular base station. Thus, since the characteristics of the distortion-compensating power amplifiers applied to the cellular base station are maintained as they are and inter modulation spurious developed due to carrier signals different in frequency can be reduced without changing the configurations of the distortion-compensating power amplifiers, the present embodiment is suitable for use in a transmitting power amplifier for a base station in particular.

According to the present invention, since a phase difference is provided between carrier signals to cancel out spurious signals, a plurality of the carrier signals can be amplified while the spurious signals are being suppressed. The application of amplifiers capable of amplifying a plurality of carrier signals to a mobile communication system makes it possible to adopt a large number of carriers in the system. Owing to its adoption, the capacity of a radio communication network can be increased equivalently. It is also possible to improve the utility of the system such as implementation of various services for providing much information.

It is further understood by those skilled in the art that the foregoing description is a preferred embodiment of the disclosed device and that various changes and modifications may be made in the invention without departing from the spirit and scope thereof.

What is claimed is:

1. A RF amplifier, comprising:
    input ports for inputting a plurality of input signals different in frequency of carrier from one another;

dividers for respectively dividing each of the plurality of input signals inputted to the input ports into plural form;

phase shifters for respectively assigning a weight of phase to each of divided signals corresponding to a number obtained by subtracting 1 from the number of divisions;

a plurality of first combiners for respectively adding up the signals different in the frequency of carrier, out of the divided signals and signals each assigned the weight of phase;

a plurality of amplifiers for respectively amplifying signals outputted from the plurality of first combiners; and a second combiner for adding signals outputted from the plurality of amplifiers to output one signal.

2. A RF amplifier according to claim 1, wherein the first combiners and the second combiners are respectively directional couplers.

3. A RF amplifier according to claim 1, wherein the phase shifters are defined as first variable phase shifters, and first variable attenuators are respectively connected to output ports of the dividers, thereby connections of the first variable phase shifters to the output ports of the dividers are established via the first variable attenuators, a second variable attenuator is inserted between one predetermined first combiner and the power amplifier and a second variable attenuator and a second variable phase shifter are inserted in series between the other first combiner and the power amplifier, a directional coupler is inserted between the second combiner and the outer output port, and further including a control circuit for adjusting the first and second variable attenuators and the first and second variable phase shifters by using a signal outputted from the directional coupler.

4. A base station suitable for use in a multi-carrier mobile communication system, which is equipped with a RF amplifier of claim 1.

5. A terminal suitable for use in a multi-carrier mobile communication system, which is equipped with a RF amplifier of claim 1.

6. A RF amplifier according to claim 1, wherein a respective one of the input ports has a respective one of the plurality of input signals different in frequency of carrier from one another input thereto, and the RF amplifier enables suppression of generation of spurious signals when the plurality of input signals are simultaneously applied thereto.

7. A RF amplifier, comprising:

s outer input ports for respectively inputting each of s (where s: integer greater than or equal to 2) signals different in frequency of carrier from one another;

s 1:m dividers respectively connected to each of the s outer input ports and for respectively dividing each of the input signals into m (where m: integer greater than or equal to 2);

s×(m−1) phase shifters respectively connected to each from second output ports of the s dividers to mth output ports thereof;

s m:1 first combiners for respectively inputting m output signals selected from s output signals sent from first output ports of the s dividers and s×(m−1) output signals of the s dividers sent via the phase shifters and combining the m output signals into one;

s power amplifiers substantially identical in characteristic, for respectively amplifying an output signal of each of the s first combiners; and an s:1 second combiner for inputting output signals of the s power amplifiers and combining the output signals thereof into one, and outputting the combined signal to an outer output port; and wherein the m output signals inputted to each of the first combiners are different in frequency of carrier from one another, and the s×m output signals inputted to the s first combiners are different from one another.

8. A RF amplifier according to claim 7, wherein a phase amount of each of the phase shifters is a substantially integral multiple of 120°/m, and phase amounts of the phase shifters connected to the same divider are different from one another.

9. A RF amplifier according to claim 8, wherein a phase of the output signal sent from the first output port of each of the dividers and phases of the output signals sent from from the second output port of thereof to the mth output port thereof via the respective phase shifters of thereof are respectively (120°/m)×k, k=−1, 0, 1, . . . (m−2).

10. A RF amplifier according to claim 7, wherein the first combiners and the second combiners are respectively directional couplers.

11. A RF amplifier according to claim 7, wherein the phase shifters are defined as first variable phase shifters, and first variable attenuators are respectively connected to the output ports of the dividers, thereby connections of the first variable phase shifters to the output ports of the dividers are established via the first variable attenuators, a second variable attenuator is inserted between one predetermined first combiner and the power amplifier and a second variable attenuator and a second variable phase shifter are inserted in series between the other first combiner and the power amplifier, a directional coupler is inserted between the second combiner and the outer output port, and further including a control circuit for adjusting the first and second variable attenuators and the first and second variable phase shifters by using a signal outputted from the directional coupler.

12. A base station suitable for use in a multi-carrier mobile communication system, which is equipped with a RF amplifier of claim 7.

13. A terminal suitable for use in a multi-carrier mobile communication system, which is equipped with a RF amplifier of claim 7.

14. A RF amplifier, comprising:

s outer input ports for respectively inputting each of s (where s: integer greater than or equal to 2) signals different in frequency of carrier from one another;

s 1:2n dividers respectively connected to each of the s outer input ports and for respectively dividing each of the input signals into 2n (where n: positive integer);

s×(2n−1) phase shifters respectively connected to each from second output ports of the s dividers to 2nth output ports thereof;

sn 2:1 first combiners for respectively inputting two output signals selected from s output signals sent from first output ports of the s dividers and s×(2n−1) output signals of the s dividers sent via the phase shifters and combining the two output signals into one;

sn power amplifiers substantially identical in characteristic, for respectively amplifying an output signal of each of the sn first combiners; and an sn:1 second combiner for inputting output signals of the sn power amplifiers and combining the output signals thereof into one, and outputting the combined signal to an outer output port; and wherein the two output signals inputted to each of the first combiners are different in frequency of carrier from each other, and the sn×2 output signals inputted to the sn first combiners are different from one another.

15. A RF amplifier according to claim 14, wherein a phase amount of each of the phase shifters is a substantially integral multiple of 120°/2n, and phase amounts of the phase shifters connected to the same divider are different from one another.

16. A RF amplifier according to claim 15, wherein a phase of the output signal sent from the first output port of each of the dividers and phases of the output signals sent from from the second output port thereof to the mth output port thereof via the respective phase shifters thereof are respectively $(120°/2n) \times k$, $k=-1, 0, 1, \ldots (2n-2)$.

17. A RF amplifier according to claim 14, wherein the first combiners and the second combiners are respectively directional couplers.

18. A RF amplifier according to claim 14, wherein the phase shifters are defined as first variable phase shifters, and first variable attenuators are respectively connected to the output ports of the dividers, thereby connections of the first variable phase shifters to the output ports of the dividers are established via the first variable attenuators, a second variable attenuator is inserted between one predetermined first combiner and the power amplifier and a second variable attenuator and a second variable phase shifter are inserted in series between the other first combiner and the power amplifier, a directional coupler is inserted between the second combiner and the outer output port, and further including a control circuit for adjusting the first and second variable attenuators and the first and second variable phase shifters by using a signal outputted from the directional coupler.

19. A base station suitable for use in a multi-carrier mobile communication system, which is equipped with a RF amplifier of claim 14.

20. A terminal suitable for use in a multi-carrier mobile communication system, which is equipped with a RF amplifier of claim 14.

* * * * *